United States Patent [19]
Fernandez

[11] Patent Number: 5,644,636
[45] Date of Patent: Jul. 1, 1997

[54] METHOD AND APPARATUS FOR SECURING DATA STORED IN SEMICONDUCTOR MEMORY CELLS

[75] Inventor: Alberto J. Fernandez, Miami, Fla.

[73] Assignee: XTec, Incorporated, Miami, Fla.

[21] Appl. No.: 367,084

[22] Filed: Dec. 30, 1994

[51] Int. Cl.⁶ ..................................................... H04L 9/00
[52] U.S. Cl. .......................... 380/4; 380/3; 380/9; 380/23; 380/25; 380/49; 380/50; 340/825.31; 340/825.34; 395/3
[58] Field of Search ................... 380/3, 4, 9, 23, 380/25, 49, 50, 59; 395/1, 3; 340/825.31, 825.34

[56] References Cited

U.S. PATENT DOCUMENTS

| | | | |
|---|---|---|---|
| 4,304,961 | 12/1981 | Campbell, Jr. | 380/23 |
| 4,799,635 | 1/1989 | Nakagawa | 380/4 X |
| 5,058,164 | 10/1991 | Elmer et al. | 380/50 |
| 5,343,527 | 8/1994 | Moore | 380/4 |
| 5,421,006 | 5/1995 | Jablon et al. | 380/4 X |

Primary Examiner—Bernarr E. Gregory
Attorney, Agent, or Firm—The Law Offices of Peter H. Priest

[57] ABSTRACT

A method and apparatus for securing data stored in semiconductor memory cells of a semiconductor device is described. A reference fingerprint corresponding to numerical representations of a measurement of the levels of charges trapped in the memory cells is generated and stored. The measurement is performed immediately after programming data to the memory cells. The reference fingerprint is then compared to a measurement of numerical representations of the levels of charges trapped in the memory cells of a memory device that has been presented to a reader. If a match occurs, then the data stored in the memory device is authenticated. An intentional offset error voltage may be applied when writing data to the memory cells to enhance the security of the data. The reference fingerprint may also be encrypted prior to storage for added security. Lastly, fuzzy logic techniques may be used to compensate for environmental and hardware related fluctuations in the levels of trapped charges of the programmed memory cells.

34 Claims, 5 Drawing Sheets

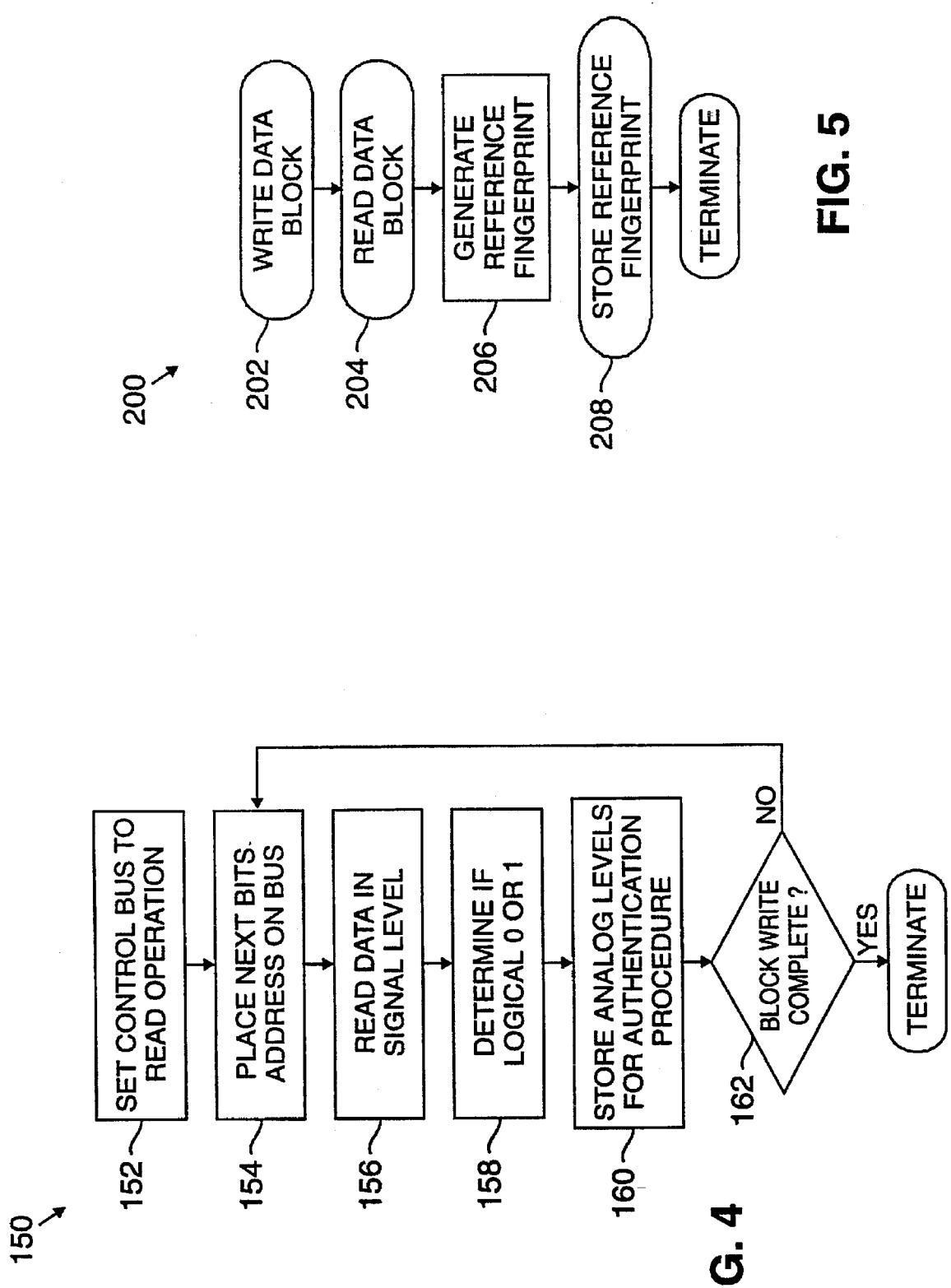

METHOD AND APPARATUS FOR SECURING DATA STORED IN SEMICONDUCTOR MEMORY CELLS

FIELD OF THE INVENTION

This invention relates generally to securing data stored in a semiconductor memory device. More particularly, the present invention concerns a technique that utilizes the physical structure and material characteristics of semiconductor memory cells for purposes of securing data which is stored in a semiconductor memory device.

BACKGROUND OF THE INVENTION

Data stored in semiconductor memory cells may easily be read and written over, and also copied from one semiconductor memory device to another unless security features are implemented to restrict access to the memory cells.

Attempts have been made to provide security for data stored in semiconductor memory cells which are fabricated on a semiconductor chip. For instance, a microprocessor has been placed in the data path between a memory array of memory cells and an input/output (I/O) port on the chip. The stored data is secured by permitting access to the data stored in the memory array only if the microprocessor is initially provided with a recognized security code. This security technique, however, may be subverted because integrated semiconductor chips are finite state devices that may be reverse-engineered. Thus, a database attacker may be able to bypass the I/O port and directly access the memory array.

In some memory cell applications, such as integrated circuit cards or chip cards that include semiconductor memory cells, it is essential to assure that the data stored in the memory cells remains absolutely secure. This is especially important for applications where a database is utilized having no central database verification system. Another application concerns the use of memory cells in computer linked or on-line payment systems. The unauthorized modification of data stored in a chip card and the unauthorized copying of the data to another chip card for counterfeiting purposes, however, is not easily detectable using present technology. For example, the presently existing data security technique of providing holograms on chip cards may be compromised with relative ease and little probability for detection.

A need, therefore, exists for an improved technique for securing data stored in memory cells of a semiconductor memory device.

SUMMARY OF THE INVENTION

The present invention provides that data stored in memory cells of a semiconductor memory device may be secured by generating a numerical data string, called a reference fingerprint, representative of the data stored in the memory cells. The reference fingerprint is related to numerical representations of the precise levels of trapped charges present in the memory cells at the time data is programmed.

In accordance with the present invention, a measurement of the levels of trapped charges present in memory cells is obtained immediately after programming of the memory cells. Based on this measurement, a reference fingerprint is generated and stored for later processing. When subsequent access to the data stored in the memory cells is desired, the levels of trapped charges present in the memory cells are measured to obtain a numerical representation or authentication fingerprint. The reference fingerprint and the authentication fingerprint are compared, and if a match occurs, then the data is authenticated. If no match occurs, then stored data may have been modified in an unauthorized manner.

In a further embodiment, the security of the data stored in memory cells may be further enhanced by writing data to the memory cells in a manner that allows for the introduction of intentional random variations to the levels of trapped charges in the memory cells.

In still a further embodiment, the reference fingerprint may be encrypted prior to storage.

In a further aspect of the invention, to ensure that the comparison of the reference fingerprint to the authentication fingerprint is reliable, fuzzy logic techniques may be utilized to obtain the reference and authentication fingerprints. The use of fuzzy logic compensates for environmental and hardware related factors which may, over time, cause fluctuations in the values of the numerical representations generated by the measurement of levels of trapped charges in the programmed memory cells.

Further features and advantages of the present invention will be readily apparent from the detailed description that follows.

DESCRIPTION OF THE DRAWINGS

FIG. 4 is a flow diagram of a method for reading data from semiconductor memory cells in accordance with the present invention;

FIG. 5 is a flow diagram of a method for generating a reference fingerprint of data stored in semiconductor memory cells in accordance with the present invention.

DETAILED DESCRIPTION

The present invention concerns a technique for securing data stored in memory cells of a semiconductor memory device. The method exploits the physical characteristics of the semiconductor materials and the geometry unique to an individual memory cell to generate a reference fingerprint of that memory cell. As described in detail below, inherent variations exist in the level of trapped charges present in a memory cell after being programmed with data. These variations in the levels are utilized to generate the reference fingerprint, and the reference fingerprint is subsequently used to determine whether the stored data is authentic.

Figure 1:
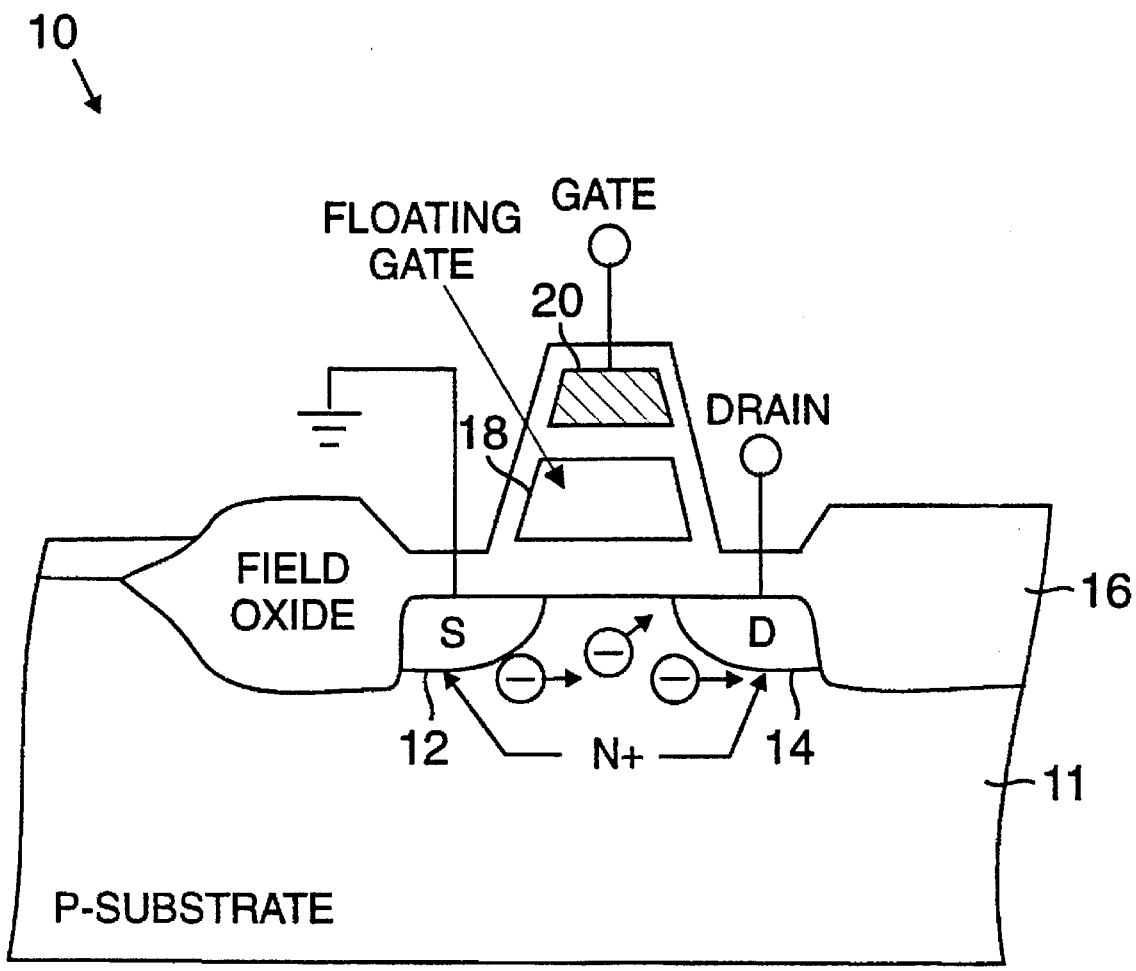
FIG. 1 illustrates a cross section of a semiconductor memory cell.

FIG. 1 shows a cross-section of a standard electrically programmable read only memory (EPROM) cell 10 which may typically be included in a conventional semiconductor memory device for purposes of data storage. It is to be understood that the use of an EPROM memory cell for describing the present invention is exemplary, and that the present method for securely storing data may be used with other memory cells having a charge storage structure similar to that of the EPROM. Further, it is to be understood that the inventive techniques described below may be similarly applied to storage devices such as integrated circuit cards or Chip Cards which include EPROMs or electrically erasable programmable read only memory (EEPROMs), or other similar devices which utilize semiconductor memories such as a ROM or a microcontroller with an on-board EPROM or ROM.

Referring to FIG. 1, the memory cell 10 is a well known device whose structure and operation are described in detail in Altera Corporation's September, 1991 "Data Book" on pages 11–14, incorporated by reference herein. For purposes of clarity, the memory cell 10 is described below only with respect to those aspects of EPROM structure and operation which are necessary for explaining the present invention.

In FIG. 1, the memory cell 10 may comprise a transistor integrated on a p-type substrate 11. The transistor comprises a source (S) 12 and a drain (D) 14 which are fabricated using well known techniques by the diffusion of N+ impurities on the substrate 11. The transistor includes a field oxide layer 16 that overlays the source 12 and the drain 14, and a floating gate 18 fabricated from a first layer of polysilicon that overlays the oxide layer 16. The transistor further comprises a gate 20 fabricated from a second layer of polysilicon that overlays the floating gate 18.

Data may be programmed in the memory cell 10 for purposes of data storage according to the well known technique of floating-gate charge injection. For example, a potential typically greater than 12 volts may be applied to the drain 14 to create a strong electric field that energizes electrons to jump from the drain 14 region to the floating gate 18 region. The electrons attracted to the floating gate 18 become trapped in the floating gate 18 when the potential is removed from the drain 14.

When charges are trapped in the floating gate 18, the threshold of the EPROM memory cell 10 changes from a relatively low value, which is associated with the memory cell 10 when no charge is present and is called an erased condition, to a higher value, which indicates that programming of the memory cell 10 has occurred. If a low voltage potential for programming a logic level low or "0" in the memory cell 10 is applied to the gate 20, then electrons are not attracted to the floating gate 18, and thus the floating gate 18 remains uncharged. On the other hand, if a high voltage potential for programming a logic level high or "1" is applied to the gate 20, then a large number of electrons will be attracted to the floating gate 18, thereby charging the floating gate 18. It is well known to one of skill in the art that typical voltages for programming high and low logic levels depend upon the type and design of the semiconductor memory device being used.

The level of charges that will be trapped in the memory cell 10 as a result of programming depends upon the characteristics of the semiconductor material and the geometry of the structures in the memory cell 10. For instance, variations in doping levels and dopant purities and the thickness of doped regions of a semiconductor substrate will cause inherent random variations in the level of charges that are trapped in a memory cell when a specific voltage level is applied for a specified amount of time during programming. These inherent random variations make reproduction or duplication of the same relative level of trapped charges in a second memory cell for purposes of obtaining an identical level of trapped charge in the second memory cell very difficult, if not impossible. As explained below, the present invention exploits the fact that the level of trapped charges in a programmed memory cell may be precisely measured immediately after programming, then stored and later used to authenticate the data stored in the programmed memory cell.

The level of charges which will be trapped in a memory cell also depends on environmental conditions, such as temperature and the presence of stray static charges, existing at the time that the memory cell is programmed. In addition, the previous level of trapped charges for the memory cell and the total number of write cycles applied to the memory cell, known as the history of the memory cell, contribute to the level of charges trapped in the memory cell. Therefore, the pattern of the trapped charges in memory cells of a memory array will vary randomly with each programming event, even when the same memory cell is programmed with the identical data.

The present invention utilizes the inherent, unique and random variations in the level of trapped charges of each programmed memory cell for the purpose of securing the data stored in a semiconductor memory device. Data stored in memory cells of a semiconductor memory array is analyzed for purposes of ensuring that the stored data has not been modified in an unauthorized manner. This authentication procedure is performed by comparing a representation of a current measurement of the levels of trapped charges in the memory cells with a reference representation of the trapped charges in the memory cells measured immediately after programming of the memory cells.

Figure 2:
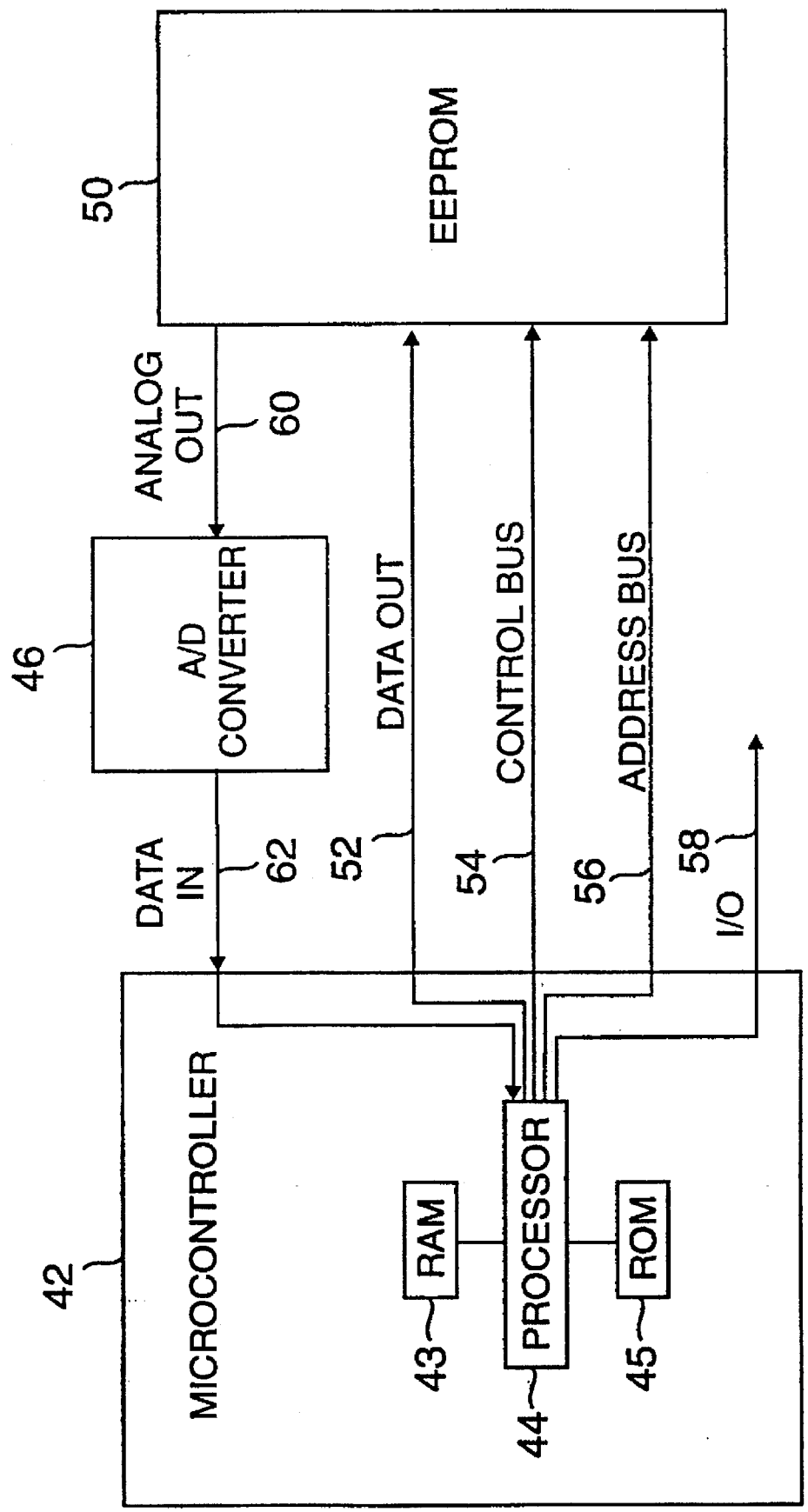
FIG. 2 illustrates a block diagram of the components of an embodiment of an apparatus for securely storing data in semiconductor memory cells according to the techniques of the present invention.

By way of example, the technique of the present invention is described below with reference to the storage of data in a semiconductor memory device 50, as shown in FIG. 2. For purposes of clarity, the device 50 is embodied as an EEPROM because such devices typically include additional means, such as analog input and output lines for erasing or re-writing data to memory cells of memory arrays, that are useful for explaining the techniques and advantages of the present invention. A memory chip utilizing non-volatile floating-gate EEPROM cell technology has been developed by Information Storage Devices Tm, and such a device may be used to practice the invention. However, it is to be understood that the memory device 50 may be any suitable device which comprises memory cells which are structurally and operationally similar to that of the EPROM memory cell 10 of FIG. 1, described above, and that most semiconductor memory devices may be adapted for use with this invention. The device 50, hereinafter, is referred to as the EEPROM 50.

In a preferred embodiment, the EEPROM 50 is constructed such that either the absolute or relative, single-ended or differential level of the voltage signal applied for programming a memory cell therein using a conventional write process is in predictable relation, and preferably in linear relation, to the level of charge that is trapped in the floating gate of the memory cell. Similarly, the level of charges trapped in the floating gate of the memory cell in the memory device 50 is in predictable relation, and preferably in linear relation, to a voltage level which may be produced when the memory cell is read using a conventional read process. It is preferable that both the read and write process exhibit the same predictable relationship with respect to the applied and measured voltage levels, respectively, at the memory cells in the EEPROM 50. Furthermore, filters, automatic gain control components, and voltage signal distortion compensation or equalization components would preferably not be used for the signal processing of either the input or output voltage signals associated with reading data from, and writing data to, the EEPROM 50.

Referring to FIG. 2, data may be written to the EEPROM 50 by use of a standard microcontroller 42, and data may be read out to the microcontroller through a standard analog-to-digital converter (ADC) 46. In one embodiment, the EEPROM 50 is included in a single semiconductor device or an integrated circuit (IC) in order to secure data in a cost efficient manner according to the techniques of the present invention. For example, the present invention may be implemented by using memory cells fabricated on a standard ISD1000A Integrated Circuit, however, most semiconductor memory devices could be adapted for use with this invention.

Typically, it would be desirable for the microcontroller 42 and the ADC 46 to be included in a device separate from the EEPROM 50, such as, for example, in a bank card machine or an automated teller machine. The EEPROM 50 then would be located on, for example, a chip card. Alternatively, the microcontroller 42 and/or the ADC 46 may be included with the EEPROM 50 in a single semiconductor device. For purposes of illustration, the components in FIG. 2 are described in terms of the EEPROM 50 being implemented on a standard integrated circuit.

Referring to FIG. 2, the microcontroller 42 suitably comprises a processor 44, such as a standard microprocessor, connected to a ROM 45 and a RAM 43, all on an integrated circuit. Alternatively, the processor 44, RAM 43 and ROM 45 may suitably be discrete devices. A data out line 52, a control bus 54 and an address bus 56 are all suitably connected from the processor 44 to the EEPROM 50 according to conventional techniques. The microprocessor 44 also comprises an input/output (I/O) port 58 which may comprise any standard interface, including but not limited to, the RS-232, I2C or the ISO/IEC 781 S3 standard chip card interface. The I/O bus port 58 is any standard interface that may be used for interconnecting the microcontroller 42 to an external device, such as a bank machine card reader or an asynchronous card swipe reader. The control bus 54 typically may comprise signal lines such as chip enable, read/write select, and output enable. An analog out line 60 from the EEPROM 50 is connected to an analog input port of the ADC 46, and a data in line 62 connects a digital output port of the ADC 46 to the processor 44.

Power supplies, signal grounds, and signal conditioning components which would ordinarily be included in the design of the EEPROM 50, the microcontroller 42 and the ADC 46 according to conventional design practices are not shown in FIG. 2.

The microprocessor 44 of the microcontroller 42 transmits control signals on the lines of the control bus 54 for controlling the performance of read and write operations with respect to the EEPROM 50. The processor 44 transmits appropriate data on the address bus 56 to select the particular memory cells or memory arrays in the EEPROM 50 where a bit or group of bits are to be read or written. The processor 44 writes data to the EEPROM 50 by applying a voltage signal on the data out line 52 whose magnitude is related to the logic level of the data bit to be written. Typically, the voltage signal levels which a microprocessor may provide on a data out line for writing a representation of the data bits "0" and "1" to a memory cell are equal to 0.5 Volts +/−10% and 4.5 Volts +/−10%, respectively.

Figure 3:
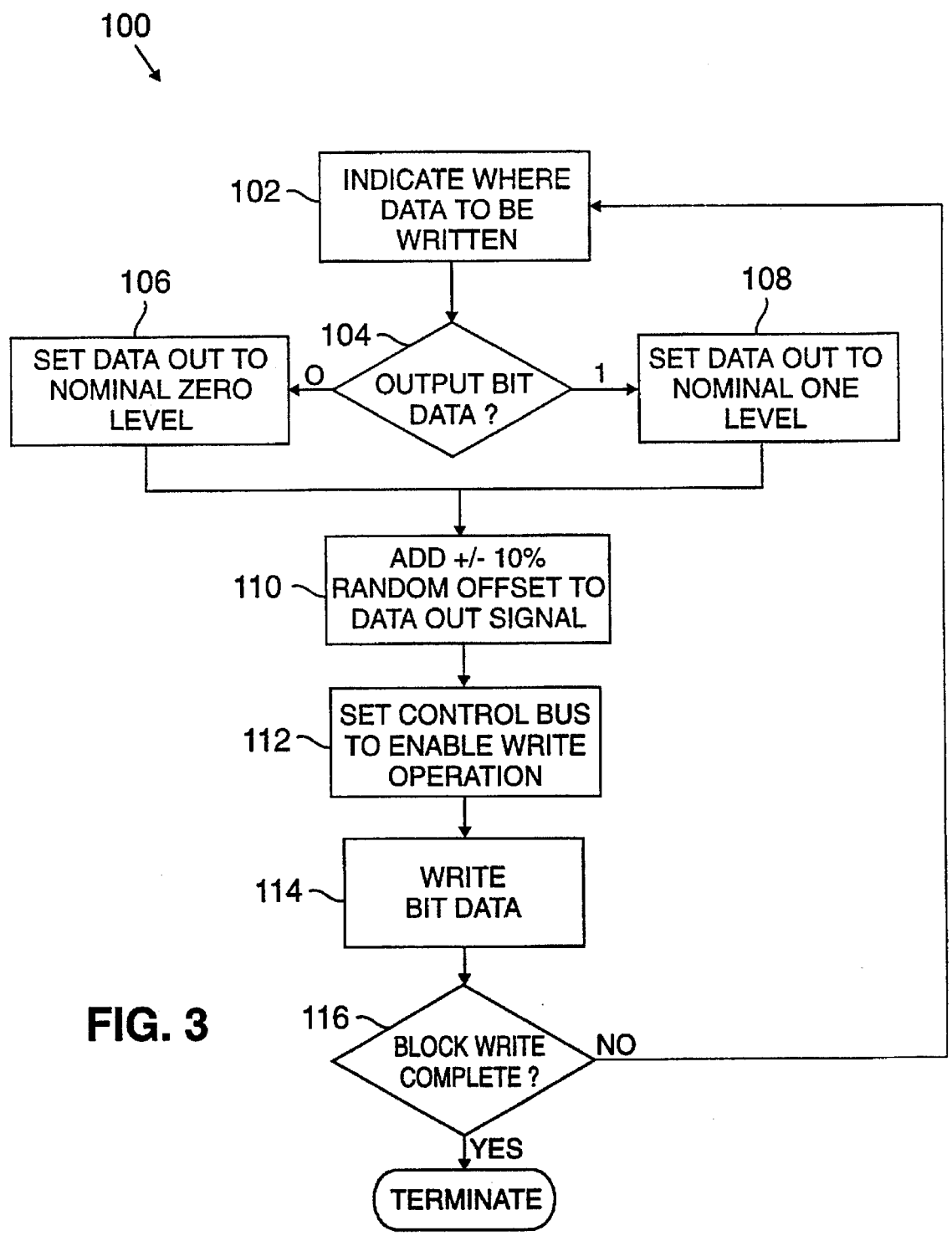
FIG. 3 is a flow diagram of a method for writing data to semiconductor memory cells in accordance with the present invention.

The technique of securing data stored in a memory cell according to the invention is described by first discussing the processes of writing data to, and reading data from, the EEPROM 50, as shown in FIGS. 3 and 4, respectively. Next, a process for producing a reference representation of the data written to the EEPROM 50 is explained with reference to FIG. 5, and a process for authenticating the data stored in the EEPROM 50 based on the previously produced reference representation is explained with reference to FIG. 6.

FIG. 3 shows a process 100 for writing a block of data to the EEPROM 50 from the microcontroller 42 according to the present invention. In particular, at step 102, the processor 44 places on the address bus 56 the address of the memory cells in the EEPROM 50 for writing a bit or group of bits of a block of data. For purposes of clarity, the process 100 is explained for the storage of one bit of data in a memory cell of the EEPROM 50.

In step 104, the processor 44 determines whether the data bit to be written is either at the logical value of "1" or "0". If the bit is at the value "0", the processor 44 proceeds to step 106, otherwise, if the bit is at the value "1", the processor 44 proceeds to step 108. In step 106, the processor 44 provides a nominal "0" level voltage signal, such as 0.5 V, to be applied on the data out line 52. Similarly, in step 108, the processor 44 provides for a nominal "1" voltage signal level, such as 4.5 V, to be applied on the data out line 52. Step 110 is executed after step 106 or step 108.

In step 110, the processor 44 adds an intentional random voltage offset on the data out line 52. This small, random intentional error is suitably on the order of +/−10% of the nominal voltage signal generated in step 106 or step 108. The introduction of an intentional offset error to the nominal voltage signal level used for writing data to the EEPROM 50 provides additional security to the stored data, because it makes it more difficult for a counterfeiter to predict the level of trapped charges in a programmed memory cell. The degree of difficulty to produce a numerical representation of a particular level of trapped charges in a memory cell is thus increased because of the additional variability introduced to the level of charges which will be trapped in a memory cell when programming occurs.

The intentional random error voltage to be applied to the data out line 52 may suitably be generated according to conventional techniques, such as, for example, by passing a current that produces the nominal voltage signal level on the data out line 52 through a noise-producing tunnel diode-based circuit that causes variations of approximately +/−10% in the level of the nominal voltage produced. In the present example, the voltage level of the signal applied to the data out line 52 for a logic "1", including an intentional offset, may range from 4.05 to 4.95 volts. In like manner, the voltage signal applied for a logic "0" may range from 0.45 to 0.55 volts.

Referring again to FIG. 3, in step 112, the processor 44 provides control signals on the control bus 56 for enabling write operation. In step 114, the bit of data is written to the EEPROM 50 in accordance with the voltage level applied on the data out line 52. The level of charges trapped in the programmed memory cell is, for purposes of illustration, in linear relation to the applied voltage level. In step 116, the processor 44 determines whether all of the bits in the block of data to be stored have been written to the EEPROM 50. If all the bits in the data block have been completely written to the EEPROM 50, the process 100 is terminated. Otherwise, the processor 44 proceeds to step 102 and continues to write data to the EEPROM 50 until the entire data block has been written.

FIG. 4 shows a process 150 for reading a block of data from the EEPROM 50 using the microcontroller 42, and storing data representative of the measured levels of trapped charges in programmed memory cells according to the present invention. For purposes of illustration, it is assumed that during a read operation, data that was previously written to the EEPROM 50 in accordance with the steps of the process 100 of FIG. 3 is read back to the processor 44 and stored in the ROM 45 for further processing according to the process 150. In addition, for clarity, the process 150 is described for the reading of the data stored in one memory cell, or reading one bit of data.

In step 152, the microprocessor 44 provides control signals on the control bus 54 for enabling a read operation, which encompasses reading the bit or bits of a block of data stored in the memory cells of the EEPROM 50. In step 154, the processor 44 places on the address bus 56 the memory cell address or addresses in the EEPROM 50 which are to be read. Based on the read signal placed on the control bus 54 and the address placed on the address bus 56, the addressed memory cell in the EEPROM 50 is read. As a result of the read process, a voltage signal whose magnitude is in linear relation to the level of trapped charges in a memory cell in the EEPROM 50 is provided on the analog out line 60. A voltage value associated with the level of charges trapped in a memory cell may be suitably obtained indirectly by nondestructibly interrogating the programmed memory cell. For example, a measured value can be obtained of the memory cell's conductivity corresponding to the stored level of trapped charges which can be used to indirectly obtain a voltage value.

In step 156, the ADC 46 detects the level of the voltage signal provided by the analog out line 60, and precisely converts the analog value of the voltage signal to a digitized numerical value. The digitized numerical representation of the voltage signal is then provided to the data in line 62 for routing to the microcontroller 42, and is stored in the ROM 45 by the processor 44.

In step 158, the processor 44 retrieves the numerical representation stored in the ROM 45 in step 156 and decodes each numerical representation into a binary number. In other words, the processor 44 determines from the numerical representation of the level of the trapped charges stored in a memory cell whether the data bit programmed was a logical "0" or "1". Alternatively, if more than one memory cell in the EEPROM 50 is read at a time, the processor 44 decodes the corresponding sequence of stored numerical representations into a binary data string. The processor 44 may format the binary data string into bytes for transmission through the I/O port 58 as may be desired for a particular semiconductor memory device application.

In step 160, the processor 44 stores the numerical representation or the sequence of numerical representations of the analog levels of the level of trapped charges in the RAM 43 for later use in the authentication process. The numerical representation for each logical "0" and "1" bit of data will vary depending on the conditions that existed at the time of programming, and the intentional random error voltage introduced in step 110 of FIG. 3. For example, for a logic string of "1010110", the corresponding numerical representation could be linearly related to the voltages of 4.10, 0.5, 4.05, 0.45, 4.75, 4.90 and 0.55 volts. This numerical representation is unique to each data block, and is used as a reference "fingerprint" to authenticate the data, as will be explained below. The fingerprint is digitally stored. The processor 44 may also format the numerical representation for transmission through the I/O port 58 and storage in an external database.

In step 162, the processor 44 determines whether all of the bits of a block of data stored in the EEPROM 50 have been read. If the data block has been completely read, the process 150 is terminated. Otherwise, the processor 44 proceeds to step 154 and continues to read data from the EEPROM 50 until all the data bits in the data block have been read.

Thus, the process 150 illustrates that a plurality of memory cells in a memory device may be read so that a group or sampling of the levels of trapped charges in the memory cells may be precisely measured using indirectly determined voltage values, and so that numerical representations of the respective voltage signal levels may be obtained.

FIG. 5 shows a process 200 which illustrates a technique for writing data to and then reading data from the EEPROM 50 for purposes of generating a data string containing numerical representations of the levels of trapped charges of the programmed memory cells called a fingerprint. The fingerprint generated immediately after data is written to the EEPROM 50 is used as a reference, and such a reference fingerprint may be used to authenticate the data stored on the EEPROM 50.

In step 202, the microcontroller 42 writes a block of data to the EEPROM 50 according to the steps of the process 100 of FIG. 3. Step 204 is then immediately performed, wherein the microcontroller 42 reads the block of data just written to the EEPROM 50 in step 202 according to the steps of the process 150 of FIG. 4. In step 206, the processor 44 retrieves the sequence of numerical representations that was stored in the RAM 43 for the data block read in step 204, and generates a reference fingerprint from that set of numerical representations. The reference fingerprint uniquely identifies that specific data in terms of both the memory device in which the data was stored, and the characteristics of the writing event. For example, the reference fingerprint for a data string of "0101" may be numerically represented as 4.6, 0.5, 4.75 and 0.45 for a particular memory device. The reference fingerprint may comprise a sequenced data string representative of the numerical representations obtained in step 204. Alternatively, the reference fingerprint may comprise a sequenced data string, known as a condensed sequence, which includes selected numerical representations of the measured levels of trapped charges obtained in step 204.

In a further alternative, the numerical representations of the memory cells read in step 204 may be selected for inclusion in the fingerprint by utilization of fuzzy logic. For example, fuzzy logic techniques may be used to generate a fuzzy set of data, which by definition is a subset of the set of numerical representations obtained in step 204. The fuzzy set primarily includes significant numerical representations, defined as those representations which are most valuable to the fuzzy set. Conventional mathematical operations associated with processing and analyzing a fuzzy set of data may be used. For instance, the ratios of the levels of trapped charges of adjacent memory cells in a semiconductor device that contain the same programmed data bit may be used as the significant numerical representations which are included in the reference fingerprint. In addition, fuzzy logic can be used, for example, to compensate for temperature variations that may distort the numerical representations obtained in step 204. Such a result would be possible because a fuzzy set could be generated that contains values which, from prior experience, compensate for the effects of temperature on adjacent cells. Other forms of compensation using fuzzy logic could also be utilized.

In a further alternative, a condensed sequence of the numerical representations may be stored as the reference fingerprint using fuzzy logic techniques.

In step 208, the processor 44 stores the numerical representations included in the reference fingerprint for use in subsequently authenticating the stored data in the EEPROM 50. The processor 44 may, for example, write the data of the reference fingerprint to a separate area on the EEPROM 50 using the steps of the process 100 of FIG. 3. Alternatively, the processor 44 may provide data representative of the reference fingerprint at the I/O port 58 for storage in an external database.

For purposes of further enhancing the security of the data stored in the EEPROM 50, the reference fingerprint may be encrypted before being written on the EEPROM 50 or stored in an external database. Encryption is performed to protect against unauthorized duplication of the reference fingerprint, where the details of the steps for generating a fingerprint become known to a counterfeiter. For example, if the technique for generating a fingerprint becomes known to an unauthorized party, the data in the memory cells may be copied to a second semiconductor memory device and another seemingly valid reference fingerprint may be generated for the data copied on the second memory device. Securely encrypting the reference fingerprint before storage prevents this potential problem.

Figure 6:
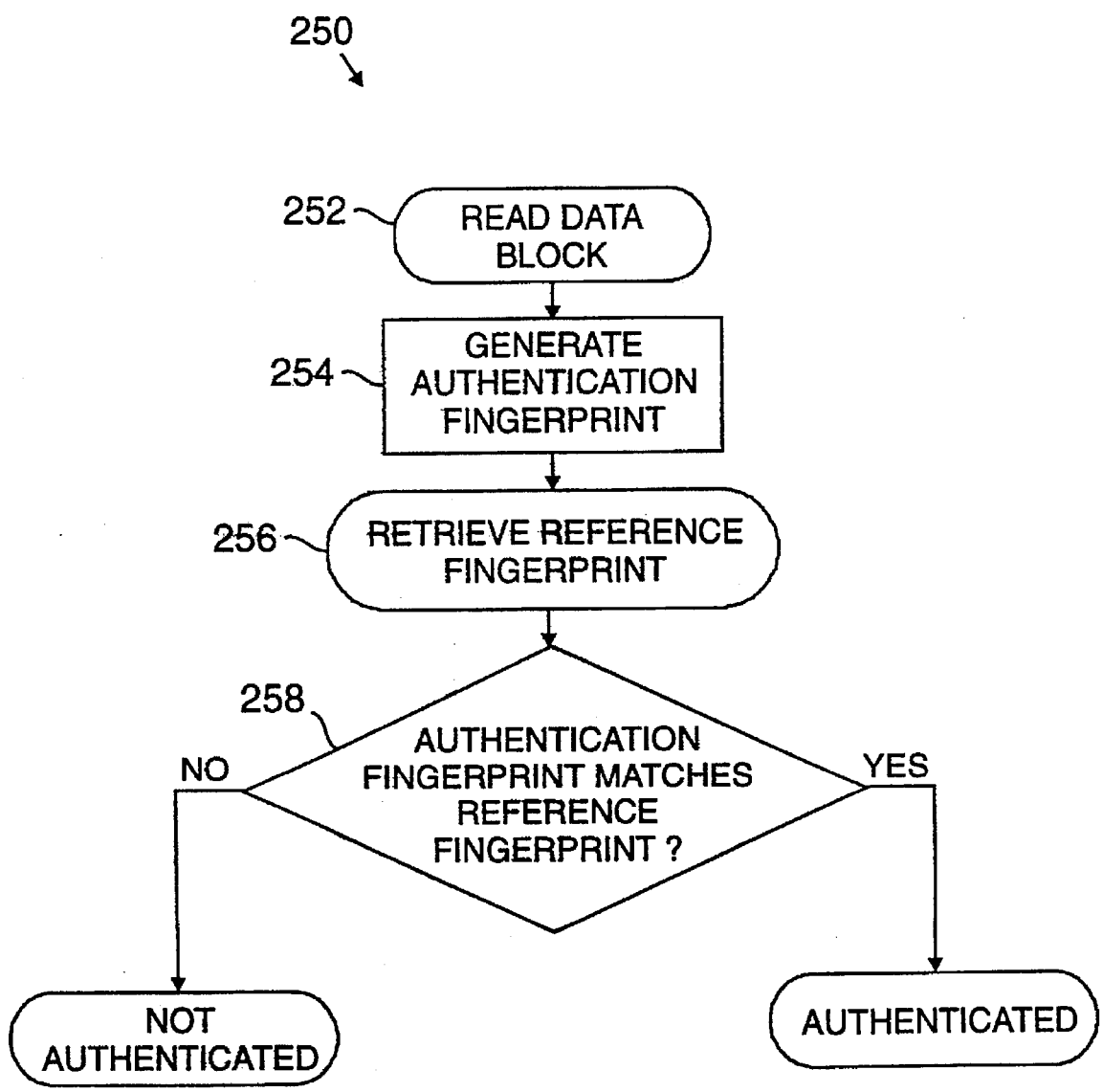
FIG. 6 is a flow diagram of a method for authenticating the data stored in semiconductor memory cells of a semiconductor memory device by utilizing a reference fingerprint generated for the memory cells in accordance with the present invention.

FIG. 6 shows a process 250 for reading a data block from the EEPROM 50 presented to, for example, a card reader. A fingerprint called an authentication fingerprint is generated based upon this reading of the data, and is compared to the reference fingerprint of the stored data for purposes of authenticating the data stored in the EEPROM 50. In step 252, the microcontroller 42 reads a block of data from the EEPROM 50 in the manner described above in the process 150. In step 254, the processor 44 generates an authentication fingerprint from the data stored in the RAM 43 in step 252 in a similar manner to the fingerprint generation performed in step 206 of the process 200. It is noted that the reference fingerprint generation technique, as explained above, controls the manner in which the authentication fingerprint is generated for purposes of authenticating data stored in memory cells in accordance with the present invention.

In step 256, the processor 44 retrieves the reference fingerprint associated with the memory cells just read. As explained above, this reference fingerprint may be accessed by reading of the memory arrays in the EEPROM 50 containing the reference fingerprint. Alternately, the reference fingerprint may be accessed over the I/O port 58 from an external database. If the reference fingerprint has been encrypted before storage, the reference fingerprint is decrypted in step 256.

In step 258, the processor 44 compares the reference fingerprint with the authentication fingerprint. If the authentication fingerprint matches the reference fingerprint within user defined comparison parameters, the data stored in the EEPROM 50 is authenticated. Otherwise, the data stored in the EEPROM 50 is not authenticated, and may in fact have been accessed and modified in an unauthorized manner.

In another embodiment, the technique according to the present invention may be used for purposes of detecting whether the data was copied to another memory device. As explained above, it is very difficult to duplicate the identical level of trapped charges in a first programmed memory cell in a second memory cell, such that an identical numerical representation of the trapped charges in the first programmed memory cell may be obtained, and consequently, so that a copy of the reference fingerprint may be generated. One skilled in the art may adapt the teachings of this invention to determine whether the data stored in programmed memory cells of a first semiconductor memory device were copied to a second semiconductor memory device. This may be done by comparing a reference fingerprint generated for the data stored in the memory cells of the first memory device to an authentication fingerprint generated from a reading of the memory cells of the second memory device.

Therefore, a counterfeiter who knows that the data block of memory cells on, for example, a genuine chip card is "10101" will try to reproduce that sequence on a bogus chip card. However, if the genuine chip card is to be verified according to the invention, and the counterfeiter does not know the fingerprint on the genuine chip card, then he will be unsuccessful. For example, if the reference fingerprint of the genuine chip card is 4.5, 0.5, 4.75, 0.45 and 4.9, and if the counterfeiter programmed the logic sequence as 4.75, 0.45, 4.2, 0.55 and 4.15 then no match will occur, and the bogus card will not be authenticated. In addition, even if the counterfeiter knows the fingerprint it will be virtually impossible to replicate it on another semiconductor memory device due to the unique physical characteristics inherent in each such device. Further, environmental conditions will also be a factor. Thus, many obstacles are placed in the path of those wishing to overcome the security of the data stored in a semiconductor memory device according to the invention.

It is to be understood that the embodiments and variations shown and described above are merely illustrative of the principles of this invention, and that various modifications may be implemented by those skilled in the art without departing from the scope and spirit of the invention.

I claim:

1. A method for securing data in a semiconductor memory cell of a semiconductor memory device, comprising the steps of:

programming data in the memory cell by applying a voltage which causes charges to be trapped in the memory cell;

making a measurement of the level of trapped charges in the memory cell after the memory cell is programmed;

generating a numerical representation of the level of trapped charges as a reference fingerprint of the memory cell; and storing the numerical representation.

2. The method of claim 1, wherein the numerical representation is written onto the semiconductor memory device.

3. The method of claim 1, wherein the numerical representation is written to an external device.

4. The method of claim 3, wherein the external device is a database.

5. The method of claim 1, wherein the step of generating the numerical representation further comprises:

encrypting the numerical representation.

6. A method for authenticating data stored in a plurality of semiconductor memory cells in a semiconductor memory device, comprising the steps of:

programming data to the plurality of memory cells by applying a plurality of voltages such that charges are trapped in each of the memory cells;

measuring the levels of the trapped charges in the plurality of memory cells after the memory cells are programmed;

generating numerical representations of the measured levels of trapped charges as a reference fingerprint;

storing the reference fingerprint; and, comparing the reference fingerprint to numerical representations of a subsequent measurement of the levels of trapped charges in the memory cells defining an authentication fingerprint, in order to determine whether the data stored in the memory cells is authentic.

7. The method of claim 6, wherein fuzzy logic techniques are utilized to generate the reference fingerprint and the authentication fingerprint to compensate for variations in the numerical representations of the measured levels of trapped charges in the memory cells which are caused by environmental and hardware related factors.

8. The method of claim 6, wherein the reference fingerprint is written onto the semiconductor memory device.

9. The method of claim 6, wherein the reference fingerprint is written to an external device.

10. The method of claims 9, wherein the external device is a database.

11. The method of claim 6, wherein the step of generating the reference fingerprint further comprises:

encrypting the reference fingerprint.

12. The method of claim 6, wherein the step of programming the memory cells further comprises:

introducing intentional random offsets to each of the applied plurality of voltages.

13. A secure semiconductor memory cell apparatus comprising:

first and second semiconductor cells;

a data out line selectively connected to the first and second semiconductor memory cells upon which voltages are applied for programming data to the first and second semiconductor memory cells, causing charges to be trapped in the first and second memory cells; and an analog out line selectively connected to the first and second semiconductor memory cells for selective connection to a measurement apparatus for making an analog measurement of the levels of trapped charges in the first and second memory cells, wherein said second memory cells are utilized for storing a reference fingerprint generated from numerical representations of the levels of trapped charges measured in the first memory cells, such that a comparison of the stored reference fingerprint to numerical representations of a subsequent measurement of the levels of trapped charges in the first memory cells provides for authenticating the data stored in the first memory cells.

14. The apparatus of claim 13, wherein the memory cells are included in an integrated circuit.

15. The apparatus of claim 13, further comprising:

an analog to digital converter comprising an input and an output, wherein the analog out line connects the input to the memory cells, and wherein the analog to digital converter converts any analog signals detected on the analog out line to digitized numerical representations and provides said numerical representations at the output.

16. The apparatus of claim 15, wherein the microcontroller and the analog to digital converter are fabricated on an integrated circuit.

17. The apparatus of claim 15, further comprising:

a microcontroller for providing applied voltages on the data out line for programming the first memory cells and the second memory cells, wherein the microcontroller further comprises a processor and a memory, wherein the processor stores in the memory the numerical representations of the measured levels of trapped charges of the first memory cells, and wherein the processor generates the reference fingerprint from the stored numerical representations obtained from the measurements involving the first memory cells and regenerates the reference fingerprint from measurements of the second memory cell, if the reference fingerprint is stored in the second memory cells.

18. The apparatus of claim 17, wherein the processor provides voltage signals on the data out line for writing the reference fingerprint to the second memory cells.

19. The apparatus of claim 17, wherein the processor provides voltage signals at an input and output port of the microcontroller for purposes of storing the reference fingerprint on an external device.

20. The apparatus of claim 19, wherein the external device is a database.

21. The apparatus of claim 17, wherein the processor compares the reference fingerprint to numerical representations of a subsequent measurement of the trapped charge levels in the first memory cells to determine the authenticity of the data stored in the first memory cells.

22. The apparatus of claim 17, wherein the processor introduces an intentional random offset to the respective voltages applied for programming the first memory cells.

23. The apparatus of claim 17, wherein the processor encrypts and stores the reference fingerprint.

24. The apparatus of claim 23, wherein the processor provides voltage signals on the data out line for writing the reference fingerprint to the second memory cells.

25. The apparatus of claim 23, wherein the processor provides voltage signals at an input and output port of the microcontroller for storage of the reference fingerprint on an external device.

26. The apparatus of claim 17, wherein the microcontroller, the analog to digital converter and the memory cells are fabricated on an integrated circuit.

27. A method for authenticating data stored in a plurality of first semiconductor memory cells in a first semiconductor memory device to prevent counterfeiting comprising the steps of:

programming the data to the plurality of first memory cells by applying a plurality of voltages, respectively, which cause charges to be trapped in the plurality of the first memory cells;

measuring the levels of the trapped charges in the plurality of first memory cells after programming the first memory cells;

generating numerical representations of the measured levels of trapped charges as a reference fingerprint;

measuring the levels of the trapped charges in a plurality of second memory cells in a second semiconductor memory device which is presented to a semiconductor memory device reader;

generating numerical representations of the measured levels of trapped charges in the second memory cells as an authentication fingerprint;

retrieving the stored reference fingerprint; and comparing the reference fingerprint to the authentication fingerprint to determine whether the data stored in the second memory cells are authentic.

28. The method of claim 27 wherein the reference fingerprint is written onto the first semiconductor memory device.

29. The method of claim 27, wherein the reference fingerprint is written onto an external device.

30. The method of claim 29, wherein the external device is a database.

31. The method of claim 27, wherein the step of storing the reference fingerprint further comprises:

encrypting the reference fingerprint.

32. The method of claim 27, wherein the step of programming the first memory cells further comprises:

introducing an intentional random offset to each of the applied plurality of voltages.

33. A method for securing data in a semiconductor memory cell of a semiconductor memory device, comprising the steps of:

programming data in the memory cell by applying a voltage which causes charges to be trapped in the memory cell, said step of programming data in the memory cell further comprising introducing an intentional random offset to the applied voltage;

measuring the level of trapped charges in the memory cell after the memory cell is programmed;

generating a numerical representation of the level of trapped charges measured; and storing the numerical representation.

34. A method for securing data in a semiconductor memory cell of a semiconductor memory device, comprising the steps of:

programming data in the memory cell by applying a voltage which causes charges to be trapped in the memory cell;

measuring the level of trapped charges in the memory cell after the memory cell is programmed;

generating a numerical representation of the level of trapped charges measured;

storing the numerical representation;

comparing the stored numerical representation to a numerical representation of a subsequent measurement of the level of trapped charges in the memory cell; and authenticating the data stored in the memory cell if the stored numerical representation matches the second numerical representation.

* * * * *